(12) United States Patent
Kusunoki et al.

(10) Patent No.: US 9,587,075 B2
(45) Date of Patent: Mar. 7, 2017

(54) ADDITION-CURABLE SILICONE COMPOSITION AND A SEMICONDUCTOR DEVICE

(71) Applicant: SHIN-ETSU CHEMICAL CO., LTD., Tokyo (JP)

(72) Inventors: Takayuki Kusunoki, Annaka (JP); Yuusuke Takamizawa, Annaka (JP); Tsutomu Kashiwagi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/090,198

(22) Filed: Apr. 4, 2016

(65) Prior Publication Data

US 2016/0304673 A1 Oct. 20, 2016

(30) Foreign Application Priority Data

Apr. 15, 2015 (JP) ................. 2015-083640

(51) Int. Cl.
  *C08G 77/20* (2006.01)
  *C08G 77/00* (2006.01)
  *C08G 77/12* (2006.01)

(52) U.S. Cl.
  CPC ............. *C08G 77/20* (2013.01); *C08G 77/12* (2013.01); *C08G 77/80* (2013.01)

(58) Field of Classification Search
  None
  See application file for complete search history.

(56) References Cited

U.S. PATENT DOCUMENTS

| 5,804,631 A * | 9/1998 | Mine ............. C08K 3/08 257/783 |
| 6,417,310 B1 | 7/2002 | Omura et al. |
| 7,943,719 B2 * | 5/2011 | Hawker ............. C08G 77/06 528/14 |

(Continued)

FOREIGN PATENT DOCUMENTS

| JP | 2000-351949 A | 12/2000 |
| JP | 2001-163981 A | 6/2001 |

(Continued)

*Primary Examiner* — Robert S Loewe
(74) *Attorney, Agent, or Firm* — Oliff PLC

(57) ABSTRACT

The invention provides an addition-curable silicone composition which provides a cured product having good performance at a low temperature and excellent resistance to a temperature change, and to provide a semiconductor device having a high reliability, whose semiconductor element is encapsulated with the cured product. The invention provides an addition-curable silicone composition comprising (A) a branched organopolysiloxane having at least two alkenyl groups and represented by the formula (1) with a short branch consisting of 1 to 4 siloxane units, (B) an organohydrogenpolysiloxane having at least two hydrosilyl groups, in an amount such that a ratio of the number of the hydrosilyl groups in component (B) to the number of the alkenyl groups in component (A) is 0.4 to 4, and (C) a hydrosilylation catalyst in a catalytic amount. The invention also provides a semiconductor device provided with a cured product obtained by curing the condensation-curable silicone composition.

9 Claims, 1 Drawing Sheet

(56) References Cited

U.S. PATENT DOCUMENTS

| | | | |
|---|---|---|---|
| 2005/0006794 A1* | 1/2005 | Kashiwagi | C08L 83/04 257/788 |
| 2006/0185780 A1 | 8/2006 | Hanada | |
| 2006/0241269 A1* | 10/2006 | Ochs | C08G 77/38 528/15 |
| 2006/0264567 A1* | 11/2006 | Shiobara | C08L 83/04 524/588 |
| 2006/0270792 A1* | 11/2006 | Kashiwagi | C08L 83/04 524/862 |
| 2008/0070333 A1 | 3/2008 | Morita et al. | |
| 2013/0266339 A1* | 10/2013 | Sugiyama | G03G 9/16 492/18 |
| 2014/0024796 A1* | 1/2014 | Mizunashi | G02B 1/041 528/31 |
| 2014/0367723 A1* | 12/2014 | Yamazaki | C08L 83/04 257/98 |
| 2015/0001569 A1* | 1/2015 | Yoshitake | C08L 83/14 257/98 |

FOREIGN PATENT DOCUMENTS

| | | |
|---|---|---|
| JP | 2002-348377 A | 12/2004 |
| JP | 2006-93354 A | 4/2006 |
| JP | 2006-256603 A | 9/2006 |

* cited by examiner

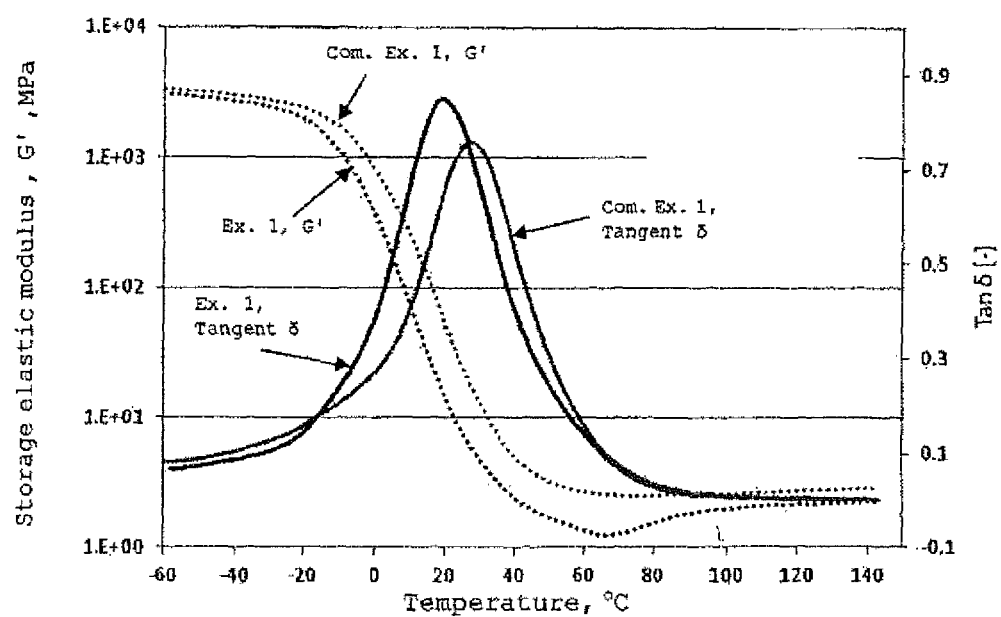

ADDITION-CURABLE SILICONE COMPOSITION AND A SEMICONDUCTOR DEVICE

This application claims the benefits of Japanese Patent Application No. 2015-083640 filed on Apr. 15, 2015, the contents of which are herein incorporated by reference.

FIELD OF THE INVENTION

The present invention relates to an addition-curable silicone composition, a cured product thereof and a semiconductor device provided with the cured product. Specifically, the present invention relates to an addition-curable silicone composition comprising an alkenyl group-containing branched organopolysiloxane having a short siloxane branch.

Addition-curable silicone resins have good heat resistance and light resistance and a rapid curing property, so that they have been used as materials for encapsulating semiconductor elements such as LEDs. For instance, Japanese Patent Application Laid-Open No. 2006-256603 describes an addition-curable silicone resin having high adhesiveness to an LED package made of a thermoplastic resin such as PPA. Japanese Patent Application Laid-Open No. 2006-93354 describes a method for encapsulating an optical semiconductor element with an addition-curable silicone resin composition by a compression molding.

As mentioned above, addition-curable silicone compositions are generally used as materials for encapsulating semiconductor elements, but their performances are not sufficient. Particularly, it is important for materials encapsulating LEDs to have crack resistance in addition to heat resistance and light resistance because the encapsulating materials are exposed to change of temperature or humidity of the atmosphere in addition to temperature change caused by switching an optical semiconductor device on and off, which all cause stress. However, the conventional condensation-curable silicone resins do not endure stress caused by temperature change so that their crack resistances are poor.

Japanese Patent Application Laid-Open No. 2002-348377 describes introduction of a branched structure into a linear silicone chain in order to improve a low-temperature property of a cured product and a method for preparing a branched organopolysiloxane by subjecting a mixture containing an organohydrogenpolysiloxane having a $CH_3(H)SiO_{1/2}$ unit to an equilibration reaction in the presence of an alkali catalyst and water. Japanese Patent Application Laid-Open No. 2001-163981 describes a branched organopolysiloxane prepared by polymerizing an alkoxy group-containing organopolysiloxane with a low-molecular weight organopolysiloxane in the presence of an acid or basic catalyst. However, these methods cannot separately control a length of the main chain and a length of the side chain. Therefore, the organopolysiloxane obtained might have a too long side chain or a network structure. Japanese Patent Application Laid-Open No. 2000-351949 describes a branched organopolysiloxane. Its side chain is too long and such an organopolysiloxane does not have sufficient resistance to temperature change.

PRIOR LITERATURES

Patent Literatures

[Patent Literature 1] Japanese Patent Application Laid-Open No. 2006-256603

[Patent Literature 2] Japanese Patent Application Laid-Open No. 2006-93354

[Patent Literature 3] Japanese Patent Application Laid-Open No. 2002-348377

[Patent Literature 4] Japanese Patent Application Laid-Open No. 2001-163981

[Patent Literature 5] Japanese Patent Application Laid-Open No. 2000-351949

DISCLOSURE OF THE INVENTION

Problems to be Solved by the Invention

One of the purposes of the present invention is to provide an addition-curable silicone composition which provides a cured product having good performance at a low temperature and excellent resistance to a temperature change, and to provide a semiconductor device having a high reliability, whose semiconductor element is encapsulated with the cured product.

Means to Solve the Problems

To solve the aforesaid problems, the present inventors have made research and found that a product obtained by curing a addition-curable silicone composition comprising an alkenyl group-containing branched organopolysiloxane represented by the following formula (1) with a short branch consisting of 1 to 4 siloxane units, provides a semiconductor device having good performance at a low and high temperature, excellent resistance to a temperature change, and high reliability.

Thus, the present invention provides an addition-curable silicone composition comprising the following components (A) to (C):

(A) a branched organopolysiloxane having at least two alkenyl groups and represented by the following formula (1):

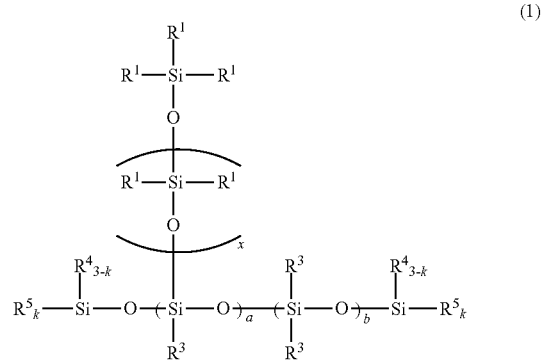

wherein $R^1$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^3$ is, independently of each other, a substituted or unsubstituted, saturated hydrocarbon group having 1 to 12 carbon atoms, a substituted or unsubstituted, aromatic hydrocarbon group having 6 to 12 carbon atoms, or an alkenyl group having 2 to 10 carbon atoms, $R^4$ is, independently of each other, a substituted or unsubstituted, saturated hydrocarbon group having 1 to 6 carbon atoms or a substituted or unsubstituted, aromatic hydrocarbon group having 6 to 12 carbon atoms, $R^5$ is, independently of each other, an alkenyl group having 2 to 10 carbon atoms, k is an integer of from 0 to 3, provided that this organopolysiloxane has at least two alkenyl groups, x is an integer of from 0 to 3, a is an integer of from 1 to 100, and b is an integer of from 0 to 300, provided that a total of a and b is 1 to 400, wherein the parenthesized siloxane units may bond randomly or form a block unit;

(B) an organohydrogenpolysiloxane having at least two hydrosilyl groups, in an amount such that a ratio of the number of the hydrosilyl groups in component (B) to the number of the alkenyl groups in component (A) is 0.4 to 4, and (C) a hydrosilylation catalyst in a catalytic amount.

Further, the present invention provides a semiconductor device provided with a cured product obtained by curing the condensation-curable silicone composition.

Effects of the Invention

The present addition-curable silicone composition provides a cured product having a lower glass-transition temperature, compared to a composition comprising a linear organopolysiloxane which has a similar length of a molecular chain and a composition comprising an organopolysiloxane which has a long branch of, in particular, 5 or more siloxane units. The cured product has good performance at a low temperature, excellent resistance to a temperature change and improved crack resistance. Accordingly, the cured product of the present addition-curable silicone composition is used for encapsulating semiconductor elements to thereby provide a semiconductor device having excellent reliability.

BRIEF EXPLANATION OF THE DRAWING

FIG. 1 shows a graph of the storage elastic modulus (dotted line) in Example 1 and Comparative Example 1 and the tangent δs (solid line) in Example 1 and Comparative Example 1.

BEST NODE OF THE INVENTION

The present invention will be described below in detail.

(A) Alkenyl Group-Containing Branched Organopolysiloxane

The present composition is characterized in that the composition comprises an alkenyl group-containing organopolysiloxane which has a branch consisting of 1 to 4 siloxane units and is represented by the following formula (1):

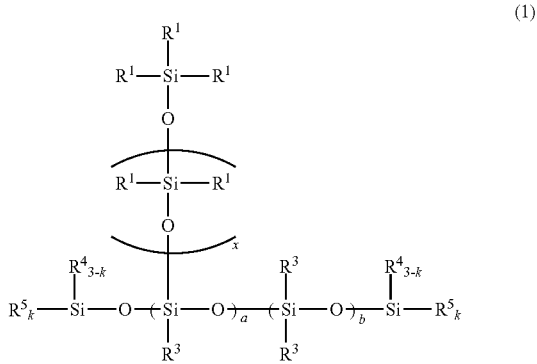

(1)

wherein $R^1$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^3$ is, independently of each other, a substituted or unsubstituted, saturated hydrocarbon group having 1 to 12 carbon atoms, a substituted or unsubstituted, aromatic hydrocarbon group having 6 to 12 carbon atoms, or an alkenyl group having 2 to 10 carbon atoms, $R^4$ is, independently of each other, a substituted or unsubstituted, saturated hydrocarbon group having 1 to 6 carbon atoms or a substituted or unsubstituted, aromatic hydrocarbon group having 6 to 12 carbon atoms, $R^5$ is, independently of each other, an alkenyl group having 2 to 10 carbon atoms, k is an integer of from 0 to 3, provided that this organopolysiloxane has at least two alkenyl groups, x is an integer of from 0 to 3, a is an integer of from 1 to 100, and b is an integer of from 0 to 300, provided that a total of a and b is 1 to 400, wherein the parenthesized siloxane units may bond randomly or form a block unit.

$R^1$ is, independently of each other, a substituted or unsubstituted, saturated hydrocarbon group having 1 to 12 carbon atoms, preferably 1 to 8 carbon atoms or a substituted or unsubstituted, aromatic hydrocarbon group having 6 to 12 carbon atoms, preferably 6 to 10 carbon atoms. Examples of the substituted or unsubstituted, saturated hydrocarbon group include alkyl groups such as a methyl group, an ethyl group, a propyl group, a butyl group, and an octyl group, and cycloalkyl groups such as a cyclopentyl group and a cyclohexyl group; and those hydrocarbon groups wherein a part or all of the hydrogen atoms bonded to the carbon atoms are substituted with a substituent such as a halogen atom such as a fluorine atom, a bromine atom and a chlorine atom, a cyano group, a glycidoxy group, a methacryloyloxy group, a mercapto group or an amino group, e.g., halogen-substituted monovalent hydrocarbon groups such as trifluoropropyl and chloropropyl groups, cyanoalkyl groups such as a β-cyanoethyl group and a γ-cyanopropyl group, 3-methacryloxypropyl group, 3-glycidyloxypropyl group, 3-mercaptopropyl group, and 3-aminopropyl group. Among these, a methyl group and a cyclohexyl group are preferred. A methyl group is more preferred. Examples of the substituted or unsubstituted, aromatic hydrocarbon group include aryl groups such as a phenyl group, a tolyl group and a naphthyl group, and aralkyl groups such as a benzyl group, a phenylethyl group and a phenylpropyl group; and those wherein a part or all of the hydrogen atoms bonded to the carbon atoms are substituted with a substituent such as a halogen atom such as a fluorine atom, a bromine atom and a chlorine atom, or a cyano group. Among these, a phenyl group and a tolyl group are preferred. A phenyl group is more preferred.

$R^3$ is, independently of each other, selected from a substituted or unsubstituted, saturated hydrocarbon group having 1 to 12 carbon atoms, preferably 1 to 8 carbon atoms, a substituted or unsubstituted, aromatic hydrocarbon group having 6 to 12 carbon atoms, preferably 6 to 10 carbon atoms, and an alkenyl group having 2 to 10 carbon atoms, preferably 2 to 8 carbon atoms. Examples of the saturated hydrocarbon group and the aromatic hydrocarbon group may be those groups defined for $R^1$. Examples of the alkenyl group include a vinyl group, an allyl group, a propenyl group, a hexenyl group and a styryl group. Among these, a vinyl group and an allyl group are preferred, and vinyl group is further preferred.

$R^4$ is, independently of each other, a substituted or unsubstituted, saturated hydrocarbon group having 1 to 6 carbon atoms or a substituted or unsubstituted, aromatic hydrocarbon group having 6 to 12 carbon atoms. Examples of the substituted or unsubstituted, saturated hydrocarbon group include alkyl groups such as a methyl group, an ethyl group, a propyl group, and a butyl group, and cycloalkyl groups such as a cyclopentyl group and a cyclohexyl group; and those wherein a part or all of the hydrogen atoms bonded to the carbon atoms are substituted with a substituent such as a halogen atom such as a fluorine atom, a bromine atom and a chlorine atom, a cyano group, a glycidoxy group, a methacryloyloxy group, a mercapto group or an amino group, e.g., halogen-substituted monovalent hydrocarbon groups such as a trifluoropropyl and chloropropyl groups, cyanoalkyl groups such as a p-cyanoethyl group and a γ-cyanopropyl group, 3-methacryloxypropyl group, 3-glycidyloxypropyl group, 3-mercaptopropyl group, and 3-aminopropyl group. Examples of the aromatic hydrocarbon group include aryl groups such as a phenyl group, a tolyl group and a naphthyl group, and aralkyl groups such as a benzyl group, a phenylethyl group and a phenylpropyl group; and a phenyl group is preferred. Among these, a methyl group, a cyclohexyl group and a phenyl group are preferred, a methyl group and a phenyl group are further preferred.

$R^5$ is, independently of each other, an alkenyl group having 2 to 10 carbon atoms, preferably 2 to 8 carbon atoms. Examples of the alkenyl group include a vinyl group, an allyl group, a propenyl group, a hexenyl group and a styryl group. Among these, a vinyl group and an allyl group are preferred, and vinyl group is further preferred. Preferably, the organopolysiloxane has at least one $R^5$ at each terminal.

k is an integer of from 0 to 3, preferably 1 to 3, further preferably 1. x is an integer of from 0 to 3, preferably 0 or 1, in particular 0. a is an integer of from 1 to 100, preferably an integer of from 1 to 75, further preferably an integer of from 1 to 50. b is an integer of from 0 to 300, preferably an integer of from 1 to 230, further preferably 1 to 110, provided that a total of a and b is 1 to 300, preferably 1 to 250, further preferably 1 to 200. The value of a/(a+b) is preferably 0.01 to 1.0.

In the aforesaid branched organopolysiloxane, at least one of the groups represented by $R^1$ is preferably an aromatic hydrocarbon group. In particular, the branched organopolysiloxane has a monovalent aromatic hydrocarbon group bonded to a silicon atom, preferably in an amount of 3% or more to 90% or less in number, further preferably 5% or more in number, based on a total number of the groups each bonded to a silicon atom. The upper limit is preferably 80% or less in number. When the branched organopolysiloxane has the aromatic hydrocarbon group in the aforesaid amount, a cured product obtained has a higher refraction index and a lower gas permeability, so that the composition is suitable for encapsulating semiconductor elements.

A method for preparing the aforesaid branched organopolysiloxane will be described below.

The branched organopolysiloxane may be prepared in a method characterized in that an organosiloxane which is represented by the following formula (3) and has two hydrolyzable groups bonded to a silicon atom at one terminal is adopted as a stating material for the introduction of a branch and is subjected to a condensation reaction. The condensation reaction is preferably carried out in the presence of a catalyst.

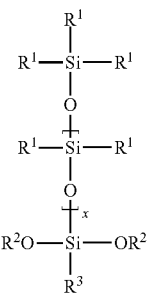

(3)

wherein $R^1$, $R^3$ and x are as defined above, and $R^2$ is a hydrogen atom or a saturated hydrocarbon group having 1 to 6 carbon atoms.

In the aforesaid formula (3), $R^2$ is, for instance, alkyl groups such as a methyl group, an ethyl group, a propyl group, a butyl group, a isopropyl group, a hexyl group and a cyclohexyl group. Among these, a methyl group and an ethyl group are preferred. A methyl group is preferred.

Examples of the organopolysiloxane represented by the formula (3) include 1,1,1,3-tetramethyl-3,3-dimethoxydisiloxane, 1-phenyl-1,1,3-trimethyl-3,3-dimethoxydisiloxane, 1,1-diphenyl-1,3-dimethyl-3,3-dimethoxydisiloxane, 1,1-diphenyl-1,3-dimethyl-3,3-diethoxydisiloxane, 1,1,1-triphenyl-3-methyl-3,3-dimethoxydisiloxane, 1,1,1-trimethyl-3-phenyl-3,3-dimethoxydisiloxane, 1,3-diphenyl-1,1-dimethyl-3,3-dimethoxydisiloxane, 1,1-diphenyl-1-methyl-3-phenyl-3,3-dimethoxydisiloxane, 1,1,1-triphenyl-3-phenyl-3,3-dimethoxydisiloxane, 1,1-diphenyl-1-methyl-3-cyclohexyl-3,3-dimethoxydisiloxane, 1,1-diphenyl-1-methyl-3-glycidyloxypropyl-3,3-dimethoxydisiloxane, 1,1-diphenyl-1-methyl-3-trifluoropropyl-3,3-dimethoxydisiloxane, 1,1,1,3,3,5-hexamethyl-5,5-dimethoxytrisiloxane, 1,1-diphenyl-1,3,3,5-tetramethyl-5,5-dimethoxytrisiloxane, 1,1,1-triphenyl-3,3,5-trimethyl-5,5-dimethoxytrisiloxane, 1,1,1,3,3-pentamethyl-5-phenyl-5,5-dimethoxytrisiloxane, 1,1,5-triphenyl-1,3,3-trimethyl-5,5-dimethoxytrisiloxane, 1,1,1,5-tetraphenyl-3,3-trimethyl-5,5-dimethoxytrisiloxane, 1,1,1,5-tetramethyl-3,3-diphenyl-5,5-dimethoxytrisiloxane, 1,1,1-trimethyl-3,3,5-triphenyl-5,5-dimethoxytrisiloxane, 1,1,1,3,3,5-hexaphenyl-5,5-dimethoxytrisiloxane, 1,1-diphenyl-1-methyl-3-vinyl-3,3-dimethoxydisiloxane, 1,1-diphenyl-1-methyl-3,3-dimethoxydisiloxane, 1,1-diphenyl-1-methyl-3,3-diphenyl-5-methyl-5,5-dimethoxytrisiloxane, 1,1-diphenyl-1-methyl-3,5,7-triphenyl-3,5,7-trimethyl-9-methyl-9,9-dimethoxypentasiloxane, 1,1-diphenyl-1-methyl-3,5,7-tri(3,3,3-trifluoropropyl)-3,5,7-trimethyl-9-methyl-9,9-dimethoxypentasiloxane, and 1,1-diphenyl-1-methyl-3-(3,3,3-trifluoropropyl)-3,3-dimethoxydisiloxane.

The compound represented by the formula (3) is condensation reacted by itself or with another organic silicon compound, preferably in the presence of a catalyst, to prepare the organopolysiloxane represented by the following formula (3'), and hereinafter this step is referred to as a condensation reaction step. The terminals of the organopolysiloxane are capped with other organic silicon compound to prepare the aforesaid branched organopolysiloxane represented by the formula (1), and hereinafter this step is referred to as an end-capping reaction step. The end-capping reaction step may be conducted in the presence of a catalyst, if needed.

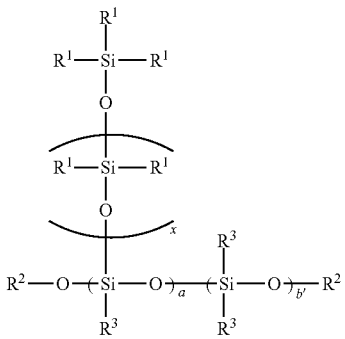

(3')

wherein $R^1$, $R^2$, $R^3$ and x are as defined above, a is an integer of from 1 to 100, b' is an integer of from 0 to 300, and a total of a and b' is 1 to 400.

Examples of the silicon compound subjected to the reaction with the compound represented by the formula (3) include organic silicon compounds represented by $R^3_2SiX_2$, wherein $R^3$ is as defined above and X is a hydrolyzable group or a halogen atom, and an organic silicon compound represented by the following formula (5):

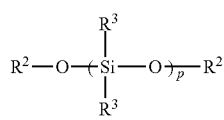

(5)

wherein $R^2$ and $R^3$ are as defined above, p is an integer of from 2 to 300, preferably 5 to 200, further preferably 10 to 100, wherein the parenthesized siloxane units may form a block unit or bond randomly.

Examples of the silicon compound represented by $R^3_2SiX_2$ include chlorosilanes such as dimethyldichlorosilane, methylphenyldichlorosilane, diphenyldichlorosilane and benzylmethyldichlorosilane; alkoxysilanes such as dimethyldimethoxysilane, methylphenyldimethoxysilane, diphenyldimethoxysilane, benzylmethyldimethoxysilane, dimethyldiethoxysilane, methylphenyldiethoxysilane, diphenyldiethoxysilane and benzylmethyldiethoxysilane; and disilanols such as diphenylsilanediol, benzylmethylsilanediol and dibenzylsilanediol. Among these, dimethyldimethoxysilane, methylphenyldimethoxysilane, diphenyldimethoxysilane and diphenylsilanediol are preferred.

Examples of the silicon compound represented by formula (5) include 1,1,3,3-tetramethyl-1,3-dimethoxydisiloxane, 1,1,3,3-tetramethyldisiloxane-1,3-diol, 1,1,3,3,5,5-hexamethyl-1,5-dimethoxytrisiloxane, 1,3,5-triphenyl-1,3,5-trimethyl-1,5-dimethoxytrisiloxane, 1,3,5-triphenyl-1,3,5-trimethyltrisiloxane-1,5-diol, 1,1,3,3,5,5-hexaphenyl-1,5-dimethoxytrisiloxane, 1,1,3,3,5,5-hexaphenyltrisiloxane-1,5-diol, and 1,3,5-tri(trifluoropropyl)-1,3,5-trimethyltrisiloxane-1,5-diol; and an oligomer or polymer of those compounds.

The compound represented by the formula (3) may be condensation reacted with a silane having a hydrocarbon group having a halogen, oxygen, nitrogen or sulfur atom, such as 3-glycidyloxypropylmethyldimethoxysilane, 3-mercaptopropyl methyldimethoxysilane and 3-aminopropylmethyldimethoxysilane.

The compound represented by the formula (3') is reacted with an organic silicon compound represented by the following formula (6), (7) or (8) to thereby end-capped, resulting in the branched organopolysiloxane represented by the formula (1).

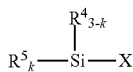

(6)

wherein $R^4$, $R^5$ and k are as defined above and X is a hydrolyzable group or a halogen atom.

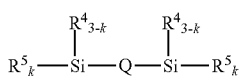

(7)

wherein $R^4$, $R^5$ and k are as defined above and Q is an oxygen atom or =N—H.

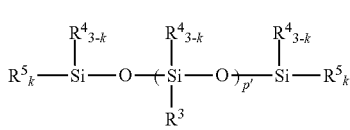

(8)

wherein $R^4$, $R^5$, $R^3$ and k are as defined above and p' is an integer of from 1 to 100.

In the aforesaid formulas, X is a hydrolyzable group or a halogen atom. Examples of the halogen atom include a chlorine atom and a bromine atom. The hydrolyzable group is represented by —OR. R is preferably a hydrogen atom or an alkyl group having 1 to 6 carbon atoms. Examples of the hydrolyzable group include a hydroxy group, a methoxy group, an ethoxy group and an isopropoxy group. Among these, a chlorine atom, a hydroxy group and a methoxy group are preferred, and a hydroxy group and a methoxy group are further preferred.

Examples of the silicon compound represented by formula (6), (7) or (8) include disiloxanes such as 1,1,3,3-tetramethyldisiloxane, 1,3-diphenyl-1,3-dimethyldisiloxane, 1,1,3,3-tetraphenyldisiloxane, 1,3-divinyl-1,1,3,3-tetramethyldisiloxane, 1,1,3,3-tetravinyl-1,3-dimethyldisiloxane, hexavinyldisiloxane, and 1,3-dimethyl-1,3-diphenyl-1,3-divinyldisiloxane; silazanes such as 1,1,3,3-tetramethyldisilazane, 1,3-diphenyl-1,3-dimethyldisilazane, 1,1,3,3-tetraphenyldisilazane, 1,3-divinyl-1,1,3,3-tetramethyldisilazane, 1,1,3,3-tetravinyl-1,3-dimethyldisilazane, hexavinyldisilazane and 1,3-dimethyl-1,3-diphenyl-1,3-divinyldisilazane; and siloxane oligomers and polymers such as 1,1,3,3,5,5-hexamethyltrisiloxane, 1,5-divinyl-1,1,3,3,5,5-hexamethyltrisiloxane, 1,1,3,3,5,5,7,7,9,9-decamethylpentasiloxane, 1,9-divinyl-1,1,3,3,5,5,7,7,9,9-decamethylpentasiloxane, 1,1,3,5,5-pentamethyl-3-phenyltrisiloxane, 1,5-divinyl-1,1,3,5,5-pentamethyl-3-phenyltrisiloxane, 1,1,3,5,7,9,9-heptamethyl-3,5,7-triphenylpentasiloxane, 1,9-divinyl-1,1,3,5,7,9,9-heptamethyl-3,5,7-triphenylpentasiloxane, 1,1,5,5-tetramethyl-3,3-diphenyltrisiloxane, 1,5-divinyl-1,1,5,5-tetramethyl-3,3-diphenyltrisiloxane, 1,5-dimethyl-1,3,3,5-tetraphenyltrisiloxane, 1,5-divinyl-1,5-dimethyl-1,3,3,3,5-tetraphenyltrisiloxane, 1,1,9,9-tetramethyl-3,3,5,5,7,7-hexaphenylpentasiloxane, and 1,9-divinyl-1,1,9,9-tetramethyl-3,3,5,5,7,7-hexaphenylpentasiloxane.

The catalyst is preferably at least one of the groups consisting of acid catalysts, basic catalysts and metal compound catalysts. The metal compound catalyst is preferably hydroxides of the elements in Group 2 of the periodic table, hydrates of hydroxides of the elements in Group 2 of the periodic table, oxides of the elements in Group 2 of the periodic table, and hydroxides and oxides of the metal elements in Groups 3-15 of the periodic table. The acid catalyst is preferably dilute hydrochloric acid and acetic acid, in particular dilute hydrochloric acid. The basic catalyst is preferably triethylamine and tetramethylammonium hydride, in particular triethylamine.

Examples of the metal compound catalysts include radium hydroxide, barium hydroxide, strontium hydroxide, calcium hydroxide, magnesium hydroxide, beryllium hydroxide, barium hydroxide, strontium hydroxide, barium oxide, strontium oxide, calcium oxide, magnesium oxide, beryllium oxide, lanthanum (III) hydroxide, cerium (IV) hydroxide, zirconium (IV) hydroxide, iron (II) hydroxide, iron (III) hydroxide, cobalt (II) hydroxide, nickel (II) hydroxide, copper (II) hydroxide, gold (III) hydroxide, zinc (II) hydroxide, cadmium (II) hydroxide, aluminum (III) hydroxide, indium (III) hydroxide, thallium (I) hydroxide, lead (II) hydroxide, bismuth (III) hydroxide, manganese (IV) oxide, iron (II) oxide and copper (II) oxide. Among these, hydroxides of elements in Group 2 of the periodic table and hydroxides of metal elements in Groups 3-15 of the periodic table are preferred in view of availability. In particular, preferred are barium hydroxide, calcium hydroxide, magnesium hydroxide, strontium hydroxide, lanthanum (III) hydroxide, aluminum (III) hydroxide, iron (II) hydroxide, iron (III) hydroxide and copper (II) hydroxide. Further, hydrates of the aforesaid hydroxides of the elements in Group 2 of the periodic table may be used. In particular, barium hydroxide octahydrate, barium hydroxide monohydrate and strontium hydroxide octahydrate are preferred.

The metal compound catalyst is preferably surface treated with a silane coupling agent before used in the condensation reaction. Any known silane coupling agents may be used. Particularly, in view of dispersibility of the catalyst, preferred are silane coupling agents which have a chemical structure similar to that of organic silicon compound to be condensed, particularly similar to that of the alkoxy group-containing organic silicon compound. Examples of the silane coupling agent include trimethoxysilane, triethoxysilane, methyltrimethoxysilane, decyltrimethoxysilane, 36 vinyltrimethoxysilane, phenyltrimethoxysilane, styryltrimethoxysilane, 3,3,3-trifluoropropyltrimethoxysilane, 3-glicydyloxypropyldimethoxymethylsilane, 3-glicydyloxypropyltrimethoxysilane, 3-methacryloxypropyltrimethoxysilane, 3-aminopropyltrimethoxysilane, 3-mercaptopropyltrimethoxysilane, 3-chloropropyltrimethoxysilane, 1,1,3,3,5,5-hexamethoxy-1,3,5-trimethyltrisiloxane, 1,1,5,5-tetramethoxy-1,3,5-trimethyltrisiloxane-3-ol, dimethyldimethoxysilane, dimethyldiethoxysilane, phenylmethyldimethoxysilane, diphenyldimethoxysilane, distyryldimethoxysilane, dipentafluorophenyldimethoxysilane and hexamethyldisilazane. Among these, trimethoxysilane, vinyltrimethoxysilane, methyltrimethoxysilane and 3-glicydyloxypropyltrimethoxysilane are preferred.

The surface treatment of the metal compound catalyst with the silane coupling agent may be conducted in any conventional manner. For instance, a wet process and a dry process are utilizable. A ratio of the metal compound to the silane coupling agent is not particularly limited. However, in order not to damage the catalyst activity, the amount of the silane coupling agent is 0.001 to 10 parts by mass, further preferably 0.01 to 5 parts by mass, relative to 100 parts by mass of the metal compound catalyst.

An amount of the catalyst may be such that the condensation reaction proceeds sufficiently. For instance, the amount of the acid catalyst is preferably 0.1 to 10% by weight, further preferably 0.5 to 5% by weight, relative to a total weight of the organic silicon compound(s) to be subjected to the condensation reaction and the acid catalyst. In the case of the metal compound catalyst, the amount is preferably 0.01 to 20% by weight, further preferably 0.1 to 10% by weight, further preferably 0.2 to 9% by weight, more preferably 0.5 to 5% by weight, relative to a total weight of the organic silicon compound (s) to be subjected to the condensation reaction and the metal compound catalyst. As long as the amount of the catalyst is in the aforementioned range, a sufficient catalytic effect for the condensation reaction is attained.

When a chlorosilane compound is used as the organic silane compound represented by the aforesaid formula (6) and the reaction is conducted in the presence of water, a catalyst may not be used because hydrochloric acid which occurs in the reaction works as a catalyst.

The aforesaid condensation reaction and the end-capping reaction may be carried out in the presence of at least one solvent. The solvent is used to control a reaction rate and a conversion, or used as a diluent for a condensate obtained. The solvent may be one or more selected from non-polar solvents and polar solvents. Examples of the non-polar solvents include hydrocarbons such as n-hexane, n-heptane and isooctane; aromatic hydrocarbons such as toluene and xylene. Examples of the polar solvents include water; alcohols such as methanol, ethanol and isopropanol; alcohol esters; ketones such as acetone, methylethylketone and cyclohexanone; ethers such as diethyl ether and dibutyl ether; esters such as ethyl acetate, isopropyl acetate and butyl acetate; cyano group-substituted hydrocarbons such as acetonitrile; amines; amides such as acetamide; halogenated hydrocarbons such as methylene chloride, chloroform and hexafluoromethaxylene; and sulfur-containing compounds such as dimethylsulfoxide. An amount of the solvent is not particularly limited and may properly be controlled. Generally, the amount is such that a concentration of the organic silicon compound(s) to be condensated is 5 to 95 mass %, preferably 20 to 80 mass %. These reactions may also be conducted without any solvent.

When a chlorosilane compound is used as the organic silane compound represented by the aforesaid formula (6), it is preferred that an acid acceptor is added in order to neutralize hydrogen chloride which occurs in the reaction and, then, the hydrogen chloride is removed from the product. Examples of the acid acceptor include alkylamines such as trimethylamine and triethylamine; nitrogen-containing heterocyclic compounds such as pyridine and piperazine; cyclic diamines such as 1,4-diazabicyclo[2.2.2]octane (DABCO) and 1,8-diazabicyclo[5.4.0]-7-undecene (DBU); silazanes such as 1,3-divinyl-1,1,3,3-tetramethyldisilazane, 1,1,3,3-tetravinyl-1,3-dimethyldisilazane, hexavinyldisilazane and 1,3-dimethyl-1,3-diphenyl-1,3-divinyldisilazane; and an inorganic acid acceptor such as magnesium hydroxide, magnesium oxide and sodium hydrogencarbonate. Among these, triethylamine, pyridine and magnesium oxide are preferred.

The end-capping reaction may be conducted as a separate step after the condensation reaction, or the condensation reaction and the end-capping reaction may be conducted in a one step. In the afore-mentioned method, the catalyst can be easily removed from the reaction product. Preferred is that the catalyst is filtrated after the condensation. Alternatively, the catalyst may be filtrated after the end-capping reaction. In the filtration, the aforesaid solvent may be added in order to control a viscosity of the reaction mixture. The present method may further comprise a step of purification in known manners, such as washing with water, stripping at a reduced pressure, and treatment with an activated carbon, in order to remove an unreacted monomer from the reaction product.

The aforesaid condensation may be conducted with heating. The reaction temperature is preferably 0 to 160 degrees C., further preferably 60 to 100 degrees C. The end-capping reaction also may be conducted with heating. The temperature for the end-capping reaction is preferably 0 to 100 degrees C., further preferably 20 to 80 degrees C. When the condensation and end-capping reaction are conducted in a one step, the reaction temperature may be 0 to 160 degrees C., preferable 20 to 80 degrees C. The reaction time may be selected properly.

The aforesaid method may further comprise a step of purification in known manners, such as washing with water, stripping at a reduced pressure, and treatment with an activated carbon, in order to remove an unreacted monomer from the reaction product. In particular, when the acid acceptor is used, a hydrochloride salt with the acid acceptor occurs. It is preferred to remove the hydrochloride salt in a known manner such as filtration, washing with water, and treatment with an activated carbon. In particular, amine hydrochloride sometimes promotes breakage of a siloxane bond or works as a catalytic poison to hydrosilylation. Therefore, the amine hydrochloride is preferably removed from the reaction product as much as possible when such acid acceptor is used in the preparation of the addition-curable organopolysiloxane composition.

(B) Organohydrogenpolysiloxane

Component (B) is an organohydrogenpolysiloxane having at least two hydrosilyl groups. The organohydrogenpolysiloxane is preferably represented by the following formula (4):

$$(R^7_3SiO_{1/2})_{r'}(R^7_2SiO_{2/2})_{s'}(R^7SiO_{3/2})_{t'}(SiO_{4/2})_{u'} \quad (4)$$

wherein $R^7$ is, independently of each other, a hydrogen atom, a substituted or unsubstituted, saturated hydrocarbon group having 1 to 12 carbon atoms, or a substituted or unsubstituted, aromatic hydrocarbon group having 6 to 12 carbon atoms, provided that at least two of $R^7$ are a hydrogen atom, r' is an integer of from 0 to 100, s' is an integer of from 0 to 300, t' is an integer of from 0 to 200, and u' is an integer of from 0 to 200, a total of r', s', t' and u' is 2 to 800, provided that r', s', t', and u' are such that this organohydrogenpolysiloxane has at least two hydrogen atoms.

Component (B) is particularly not such represented by the following formula (a):

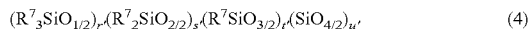

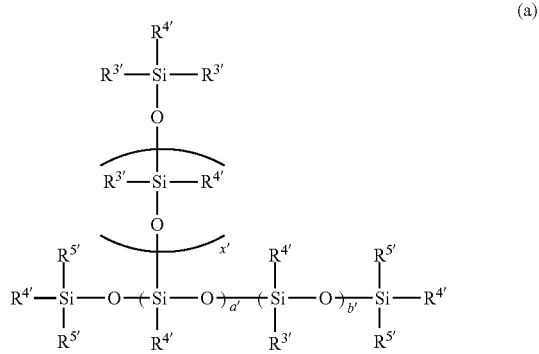

wherein $R^{3'}$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^{4'}$ is, independently of each other, a hydrogen atom, a substituted or unsubstituted, saturated hydrocarbon group having 1 to 12 carbon atoms, or a substituted or unsubstituted, aromatic hydrocarbon group having 6 to 12 carbon atoms, $R^{5'}$ is, independently of each other, a substituted or unsubstituted, saturated hydrocarbon group having 1 to 6 carbon atoms or a substituted or unsubstituted, aromatic hydrocarbon group having 6 to 12 carbon atoms, provided that at least two of $R^{4'}$ are a hydrogen atom, x' is an integer of from 0 to 3, preferably 0 or 1, further preferably 0, a' is an integer of from 1 to 100, and b' is an integer of from 0 to 300, provided that a total of a' and b' is 1 to 400, wherein the parenthesized siloxane units may bond randomly or form a block unit.

Component (B) is further particularly an organohydrogenpolysiloxane having a linear, cyclic or network structure or an branched organohydrogenpolysiloxane having at least one long side chain of 5 or more silicon atoms, further preferably a linear organohydrogenpolysiloxane. In addition to these organohydrogenpolysiloxanes, the present composition may further comprise an organohydrogenpolysiloxane represented by the following formula (a') as an optional component.

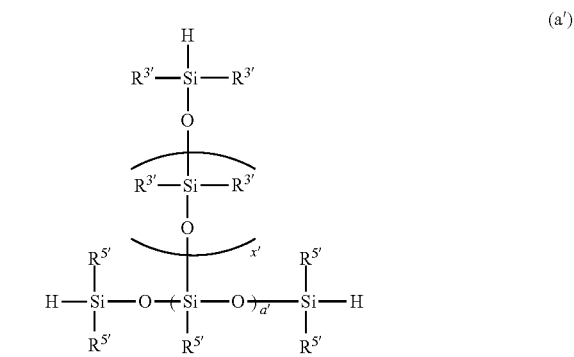

wherein a' is an integer of from 1 to 10, preferably 1 to 3, and $R^3$ and $R^{5'}$ are as defined above, preferably a methyl group or a phenyl group. x' is as defined above, preferably 0 or 1, further preferably 0.

Examples of the saturated hydrocarbon group include alkyl groups such as a methyl group, an ethyl group, a propyl group, a butyl group, and an octyl group, and cycloalkyl groups such as a cyclopentyl group and a cyclohexyl group; and those hydrocarbon groups wherein a part or all of the hydrogen atoms bonded to the carbon atoms are substituted with a substituent such as a halogen atom such as a fluorine atom, a bromine atom and a chlorine atom, a cyano group, a glycidoxy group, a methacryloyloxy group, a mercapto group or an amino group, e.g., halogen-substituted monovalent hydrocarbon groups such as trifluoropropyl and chloropropyl groups, cyanoalkyl groups such as a β-cyanoethyl group and a γ-cyanopropyl group, 3-methacryloxypropyl group, 3-glycidyloxypropyl group, 3-mercaptopropyl group, and 3-aminopropyl group. Among these, a methyl group and a cyclohexyl group are preferred. A methyl group is more preferred. Examples of the aromatic hydrocarbon group include aryl groups such as a phenyl group, a tolyl group and a naphthyl group, and aralkyl groups such as a benzyl group, a phenylethyl group and a phenylpropyl group. At least two of $R^7$ are a hydrogen atom and the remaining $R^7$ is preferably a methyl group or a phenyl group.

In the aforesaid formula (4), r' is preferably an integer of from 0 to 75, further preferably an integer of from 0 to 50. s' is preferably an integer of from 0 to 200, further preferably an integer of from 0 to 100. t' is preferably an integer of from 0 to 100, further preferably an integer of from 0 to 50. u' is preferably an integer of from 0 to 100, further preferably an integer of from 0 to 50. A total of r', s', t' and u' is preferably 2 to 400, further preferably 2 to 200. In particular, a linear organohydrogenpolysiloxane whose t' and u' are 0 and r' is 2 is preferred, wherein s' is an integer of from 1 to 300, preferably 1 to 200, further preferably 1 to 100. Component (B) is also preferably a polysiloxane resin wherein a total of t' and u' in formula (4) is 1 to 400, preferably 1 to 200, further preferably 1 to 100.

In the aforesaid organohydrogenpolysiloxane, at least one of the groups represented by $R^7$ is preferably an aromatic hydrocarbon group. In particular, the organohydrogenpolysiloxane has a monovalent aromatic hydrocarbon group bonded to a silicon atom, preferably in an amount of 3% or more to 90% or less in number, further preferably 5% or more in number, based on a total number of the groups each bonded to a silicon atom. The upper limit is preferably 80% or less in number. When the organohydrogenpolysiloxane has the aromatic hydrocarbon group in the aforesaid amount, the cured product has a higher refraction index and a lower gas permeability and component (B) is well compatible with component (A), so that the cured product has an excellent transparency. Therefore, the composition is suitable as materials for semiconductor elements.

An amount of component (B) is such that a ratio of the number of the hydrosilyl groups in component (B) to the number of the alkenyl groups in component (A) is 0.4 to 4, preferably 0.6 to 2.5, further preferably 0.8 to 2.0. If the amount is less than the afore-mentioned lower limit, the amount of SiH group is insufficient and, thereby, curing does not proceed satisfactorily. If the amount exceeds the aforementioned upper limit, unreacted SiH groups cause a side reaction such as a dehydrogenation. When the composition comprises component (D) described below, the amount of component (B) may be such that a ratio of the number of the hydrosilyl groups in component (B) to the total number of the alkenyl groups in components (A) and (D) is in the aforesaid range. When the composition further comprises the compound represented by the formula (a), the amount of component (B) may be such that a ratio of the total number of the hydrosilyl groups in component (B) and compound (a) to the total number of the alkenyl groups in component (A) or in components (A) and (D) is in the aforesaid range.

(C) Hydrosilylation Catalyst

Component (C) is a hydrosilylation catalyst. Any known catalyst may be used and not particularly limited. Preferred is a catalyst selected from an element of the platinum group metals and a compound including an element of the platinum group metals. Examples of these catalysts include platinum catalysts such as platinum, including platinum black, platinum chloride, a chloroplatinic acid, a complex of platinum with an olefin such as a complex of platinum with a divinylsiloxane, and a complex of a platinum with a carbonyl; palladium catalysts; and rhodium catalysts. The catalyst may be used singly or two or more in combination of them. Preferred are chloroplatinic acid and a complex of platinum with an olefin such as a complex of platinum with divinylsiloxane.

Component (C) may be used in a catalytic amount. The catalytic amount is such that the hydrosilylation is accelerated and may be properly decided, depending on a desired curing rate. For instance, when a platinum group metal catalyst is used, the amount, reduced to a platinum group metal, is preferably $1.0 \times 10^{-4}$ to 1.0 part by mass, more preferably $1.0 \times 10^{-3}$ to $1.0 \times 10^{-1}$ part by mass, relative to the total 100 parts by mass of components (A) and (B), in view of reactivity. When the composition comprises component (D) mentioned below, the aforesaid amount of component (C) is relative to the total 100 parts by mass of components (A), (B) and (D).

(D) Organopolysiloxane Resin

The present composition may further comprise an organopolysiloxane having a network structure and having at least two alkenyl groups. The organopolysiloxane is represented by the following formula (2):

wherein $R^8$ is, independently of each other, selected from the group consisting of a substituted or unsubstituted, saturated hydrocarbon group having 1 to 12 carbon atoms, a substituted or unsubstituted, aromatic hydrocarbon group having 6 to 12 carbon atoms, and an alkenyl group having 2 to 10 carbon atoms, provided that at least two of Re are an alkenyl group, r is an integer of from 0 to 100, s is an integer of from 0 to 300, t is an integer of from 0 to 200, and u is an integer of from 0 to 200, provided that a total of t and u is 1 to 400 and a total of r, s, t and u is 2 to 800, r, s, t, and u are such that this organopolysiloxane has at least two alkenyl groups. This organopolysiloxane may be prepared in any known manner and may be commercially available one.

Examples of the saturated hydrocarbon group and the aromatic hydrocarbon group may be those defined for $R^1$. Examples of the alkenyl group may be those defined for $R^3$. At least two of $R^e$ are an alkenyl group and the remaining $R^8$ is preferably a methyl group or a phenyl group.

r is an integer of from 0 to 100, preferably an integer of from 1 to 75, further preferably an integer of from 2 to 50. s is an integer of from 0 to 300, preferably an integer of from 0 to 200, further preferably an integer of from 0 to 100. t is an integer of from 0 to 200, preferably an integer of from 1 to 100, further preferably an integer of from 1 to 50. u is an integer of from 0 to 200, preferably an integer of from 1 to 100, further preferably an integer of from 1 to 50. A total of t and u is 1 to 400, preferably 1 to 200, further preferably 1 to 100. A total of r, s, t and u is 2 to 800, preferably 2 to 400, further preferably 2 to 200.

The organopolysiloxane may be prepared by a co-condensation of an organic silicone compound having an alkenyl group such as a vinyl group or an allyl group, e.g. silane, siloxane and silazane with other silane or siloxane. The alkenyl group-containing silane is preferably dimethylvinyl chlorosilane, methylvinyl dichlorosilane, vinyltrichlorosilane, trivinylchlorosilane, or vinylmethylphenylchlorosilane, or alkoxy or silanol derivatives of these. Examples of the alkenyl group-containing siloxane include a dimer, oligomer and polymer including the these alkenyl group-containing silane unit.

The silane and siloxane subjected to the co-condensation with the aforesaid alkenyl group-containing organic silane may preferably have a hydrocarbon group having a halogen, oxygen, nitrogen or sulfur atom, but is not limited. Examples of the silane and siloxane include trimethylchlorosilane, dimethyldichlorosilane, methyltrichlorosilane, triphenylchlorosilane, diphenylmethylchlorosilane, phenyldimethylchlorosilane, phenylmethyldichlorosilane, diphenyldichlorosilane, phenyltrichlorosilane, tetrachlorosilane, triethylchlorosilane, diethyldichlorosilane, ethyltrichlorosilane, cyclohexylmethyldichlorosilane and cyclohexyltrichlorosilane, and alkoxy or silanol derivatives of these; trifluoropropyltrimethoxysilane, β-cyanoethyltrimethoxysilane, 3-methacryloxypropyltrimethoxysilane, 3-glycidyloxypropyltrimethoxysilane, 3-mercaptopropyltrimethoxysilane, and 3-aminopropyltrimethoxysilane. An oligomer and polymer of these may be preferably used as the siloxane. The co-condensation may be conducted according to any known manners.

An amount of component (D) is 5 to 900 parts by mass, preferably 10 to 800 parts by mass, further preferably 20 to 600 parts by mass, relative to 100 parts by mass of component (A). When the composition comprises component (D) in the aforesaid amount, a rubbery cured product is obtained.

The present composition may further comprise a linear organopolysiloxane having an alkenyl group. In this case, the amount of component (D) may be adjusted such that a ratio of the total number of the hydrosilyl groups in the composition to the total number of the alkenyl groups in the composition is in the aforesaid range. The linear organopolysiloxane having an alkenyl group may be any conventional one.

The present silicone composition may further comprise other additives such as a fluorescent material, an inorganic filler, an adhesion-imparting agent, and a curing inhibitor in addition to components (A) to (D), if needed. Each of component will be explained below in detail.

Fluorescent Material

Any conventional fluorescent material may be used and not particularly limited. For instance, preferred is such that absorbs light generated by a semiconductor light-emitting diode having, as a light emitting layer, a semiconductor element, in particular a nitride semiconductor element, and converts its wavelength to different one. The fluorescent material is preferably selected from, for instance, the group consisting of nitride fluorescent materials and oxynitride fluorescent materials which are activated mainly by lanthanide elements such as Eu and Ce; fluorescent materials activated mainly by lanthanide elements such as Eu or by transition metal elements such as Mn, such as alkaline earth metal halogen apatites, alkaline earth metal halogen borates, alkaline earth metal aluminates, alkaline earth metal silicates, alkaline earth metal sulfides, alkaline earth metal thiogallates, alkaline earth metal silicon nitrides and germinates; rare earth metal aluminates and rare earth metal silicates which are activated mainly by lanthanide elements such as Ce; organic fluorescent materials and organic complex fluorescent materials which are activated mainly by lanthanide elements such as Eu; and Ca—Al—Si—O—N type oxynitride glass fluorescent materials.

Examples of the nitride fluorescent material which is activated mainly by lanthanide elements such as Eu and Ce include $M_2Si_5N_8$:Eu, $MSi_7N_{10}$:Eu, $M_{1.8}Si_5O_{0.2}N_8$:Eu and $M_{0.9}Si_7O_{0.1}N_{10}$:Eu, wherein M is at least one selected from the group consisting of Sr, Ca, Ba, Mg and Zn.

Examples of the oxynitride fluorescent material which is activated mainly by lanthanide elements such as Eu and Ce include $MSi_2O_2N_2$:Eu, wherein M is at least one selected from the group consisting of Sr, Ca, Ba, Mg and Zn.

Examples of the alkaline earth metal halogen apatite fluorescent material which is activated mainly by lanthanide elements such as Eu or transition metal elements such as Mn include $M_5(PO_4)_3$X:R, wherein M is at least one selected from the group consisting of Sr, Ca, Ba, Mg and Zn, X is at least one selected from the group consisting of F, Cl, Br and I, and R is at least one of Eu and Mn.

Examples of the alkaline earth metal halogen borate fluorescent material include $M_2B_5O_9$X:R, wherein M is at least one selected from the group consisting of Sr, Ca, Ba, Mg and Zn, X is at least one selected from the group consisting of F, Cl, Br and I, and R is at least one of Eu and Mn.

Examples of the alkaline earth metal aluminate fluorescent material include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R and $BaMgAl_{10}O_{17}$:R, wherein R is at least one of Eu and Mn.

Examples of the alkaline earth metal sulfide fluorescent material include $La_2O_2S$:Eu, $Y_2O_2S$:Eu and $Gd_2O_2S$:Eu.

Examples of the rare earth metal aluminate fluorescent material which is activated mainly by lanthanide elements such as Ce include YAG type fluorescent materials represented by compositional formulas: $Y_3Al_5O_{12}$: Ce, $(Y_{0.8}Gd_{0.2})_3Al_5O_{12}$: Ce, $Y_3$ $(Al_{0.8}Ga_{0.2})_5O_{12}$:Ce, and $(Y,Gd)_3$ $(Al,Ga)_5O_{12}$ and those compounds where a part or the whole of Y are replaced with Tb or Lu, such as $Tb_3Al_5O_{12}$:Ce and $Lu_3Al_5O_{12}$:Ce.

Examples of the other fluorescent materials include ZnS:Eu, $Zn_2GeO_4$:Mn and $MGa_2S_4$:Eu, wherein M is at least one selected from the group consisting of Sr, Ca, Ba, Mg and Zn, and X is at least one selected from the group consisting of F, Cl, Br and I.

The afore-mentioned fluorescent materials may comprise at least one selected from the group consisting of Tb, Cu, Ag, Au, Cr, Nd, Dy, Co, Ni and Ti, in place of Eu or in addition to Eu, if needed.

The Ca—Al—Si—O—N type oxynitride glass fluorescent material comprises, as a matrix, oxynitride glass comprising 20 to 50 mole % of $CaCO_3$, calculated as CaO, 0 to 30 mole % of $Al_2O_3$, 25 to 60 mole % of SiO, 5 to 50 mole % of AlN and 0.1 to 20 mole % of rare earth metal oxides or transition metal oxides, wherein the total amount of the aforesaid components is 100 mole %. The fluorescent material with the oxynitride glass matrix preferably comprises nitrogen atoms in an amount of 15 weight % or less and preferably comprises, besides rare earth metal oxides ions, the other rare earth metal ions which work as a sensitizer in an amount of 0.1 to 10 mole %, calculated as rare earth metal oxides, in the fluorescent glass as a co-activator.

Other fluorescent materials which have a similar function and provide similar effects may be used.

An amount of the fluorescent material is preferably 0.1 to 2,000 parts by mass, more preferably 0.1 to 100 parts by mass, relative to 100 parts by mass of the components other than the fluorescent material, for instance, 100 parts by mass of components (A) to (C). When the present cured product is used as a wavelength conversion film comprising a fluorescent material, the amount of the fluorescent material is preferably 10 to 2,000 parts by mass. The fluorescent material preferably has a mean diameter of 10 nm or more, more preferably 10 nm to 10 µm, further preferably 10 nm to 1 µm. The mean diameter is determined from a particle size distribution obtained in a laser diffraction method using a Cilas laser measurement instrument.

Inorganic Filler

Examples of the inorganic filler include silica, fumed silica, fumed titanium dioxide, alumina, calcium carbonate, calcium silicate, titanium dioxide, iron (III) oxide and zinc oxide. The inorganic filler may be used singly or in combination of two or more of them.

An amount of the inorganic filler may be 20 parts by mass or less, preferably 0.1 to 10 parts by mass, relative to total 100 parts by mass of components (A) to (C), but not limited to these.

Adhesion-Imparting Agent

The present silicone composition may comprise an adhesion-imparting agent in order to add adhesiveness to a cured product, if needed. Examples of the adhesion-imparting agent include organosiloxane oligomers having at least two, preferably three, functional groups selected from the group consisting of a hydrogen atom bonded to a silicon atom, an alkenyl group, an alkoxy group and an epoxy group. The organosiloxane oligomer preferably has 4 to 50 silicon atoms, more preferably 4 to 20 silicon atoms. The adhesion-imparting agent may be organooxysilyl-modified isocyanurate represented by the following general formula (9) or a hydrolysis and condensation product of the compound, i.e. organosiloxane-modified isocyanurate.

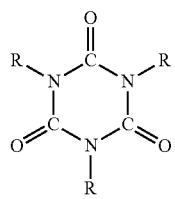
(9)

R is, independently of each other, an organic group represented by the following formula (10) or an unsaturated aliphatic hydrocarbon group which may comprise an oxygen atom, provided that at least one of R is the group represented by the formula (10).

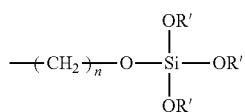
(10)

wherein R' is a hydrogen atom or a monovalent hydrocarbon group having 1 to 6 carbon atoms and n is an integer of from 1 to 6, preferably 1 to 4. The unsaturated aliphatic hydrocarbon group is preferably a linear or branched alkenyl group having 2 to 8 carbon atoms, further preferably 2 to 6 carbon atoms, such as a vinyl group, an allyl group, a 1-butenyl group, a 1-hexenyl group, a 2-methylpropenyl group and a (meth)acryl group.

An amount of the adhesion-imparting agent is 10 parts by mass or less, preferably 0.1 to B parts by mass, more preferably 0.2 to 5 parts by mass, relative to total 100 parts by mass of components (A) to (C). When the amount of the adhesion-imparting agent does not exceed the aforesaid upper limit, high hardness of the cured product is attained and surface tackiness of the cured product is avoided.

Curing Inhibitor

The present silicone composition may further comprise a curing inhibitor in order to suppress the reactivity to improve storage stability. Examples of the curing inhibitor include triallylisocyanurate, alkyl maleate, acetylene alcohols, silane-modified or siloxane-modified product of these, hydroperoxide, tetramethylethylenediamine, benzotriazole and a mixture of them. An amount of the curing inhibitor is preferably 0.001 to 1.0 part by mass, further preferably 0.005 to 0.5 part by mass, relative to the total 100 parts by mass of components (A) to (C).

Other Additives

The present silicone composition may comprise other additives besides the aforesaid components. Examples of the other additives include anti-aging agents, radical polymerization inhibitors, flame retardants, surfactants, antiozonants, light stabilizers, thickeners, plasticizers, antioxidants, heat stabilizers, electrical conductivity-imparting agents, antistatic agents, radiation insulating agents, nucleating agents, phosphorus-type peroxide decomposers, lubricants, pigments, metal-inactivating agents, physical property-adjusting agents and organic solvents. These optional components may be used singly or in combination of two or more of them.

The simplest embodiment of the present silicone composition consists of components (A), (B) and (C) or consists of components (A), (B), (C) and (D). The composition consisting of components (A), (B) and (C) and the fluorescent material is also preferred. In particular, it is preferred that the composition does not comprise any inorganic filler such as silica, in order to prepare a cured product having a higher transparency. The inorganic filler is as described above.

The present silicone composition may be prepared in any known manners. For instance, the composition may be prepared by mixing component (A), component (B), component (C), optionally component (D) and the other components in any manner. For instance, the aforesaid components are placed in a commercial stirrer, such as THINKY CONDITIONING MIXER, ex Thinky Corporation, and mixed homogeneously for about 1 to 5 minutes to prepare the present silicone composition.

The present silicone composition may be cured in any known manners. Curing conditions are not particularly limited. For instance, the composition may be cured at 60 to 180 degrees C. for 1 to 12 hours. In particular, the composition is cured stepwise in the range of 60 to 150 degrees C. The stepwise curing preferably consists of the following two steps. The silicone composition is first heated at 60 to 100 degrees C. for 0.5 to 2 hours to be defoamed sufficiently. Subsequently, the composition is heated at 120 to 180 degrees C. for 1 to 10 hours to cure. Through these steps, the composition is sufficiently cured, no bubble occur and the cured product is colorless and transparent, even when a cured product has a large thickness. In the present specification, "colorless and transparent" means that a light transmittance at 450 nm of a cured product having a thickness of 1 mm is 80% or more, preferably 85% or more, particularly preferably 90% or more.

The silicone composition provides a cured product having a high optical transparency. Accordingly, the present silicone composition is useful as an encapsulating material for LED elements, in particular blue LED elements and violet LED elements. The encapsulation of LED elements with the present silicone composition may be carried out in any known manners. For instance, a dispense method and a compression molding method may be used.

On account of the properties such as excellent crack resistance, heat resistance, light resistance and transparency, the present silicone composition and cured product are useful also as materials for displays, optical recording mediums, optical apparatus, optical components and optical fibers, and photo/electron functional organic materials and materials for integrated semiconductor circuit-related elements.

EXAMPLES

The present invention will be explained below in further detail with reference to a series of the Examples and the Comparative Examples, though the present invention is in no way limited by these Examples.

In the following descriptions, the weight average molecular weight (Mw) was determined by gel permeation chromatography, i.e., GPC, and reduced to polystyrene. Conditions in the GPC were as follows.

[GPC Conditions]
Solvent: Tetrahydrofuran
Flow rate: 0.6 mL/min.
Columns: all provided by TOSOH Cop.
TSK Guardcolumn SuperH-L
TSKgel SuperH4000 (6.0 mm I.D.×15 cm×1)
TSKgel SuperH3000 (6.0 mm I.D.×15 cm×1)
TSKgel SuperH2000 (6.0 mm I.D.×15 cm×2)
Column Temperature: 40 degrees C.
Injection Volume: 20 micro liters of a 0.5% by weight solution in THF.
Detector: Differential refractive index detector (RI)

An amount of a Vi group (mol/100 g) and an amount of an SiH group (mol/100 g) were calculated from a value of an integral value of a hydrogen atom which was obtained in $^1$H-NMR spectra at 400 MHz, using dimethylsulfoxide as an internal standard. The $^1$H-NMR spectra was obtained with ULTRASHIELD™ 400PLUS, ex BRUKER Corporation. $^{29}$Si-NMR spectra was obtained with RESONANCE500, ex JEOL Ltd.

Synthesis Example 1

Synthesis of Branched Organopolysiloxane (A-1)

63.7 Grams (0.2 mol) of 1,1-diphenyl-1,3-dimethyl-3,3-dimethoxydisiloxane, 1198.5 grams (2.23 mols) of polymethylphenylsiloxane-α,ω-diol, Mw-537.43, and 48.82 grams (0.42 mol) of dimethylvinylmethoxysilane were mixed and heated to 60 degrees C. 3.15 Grams of Sr(OH)$_2$.8H$_2$O were added to the mixture and, then, these compounds were reacted at 60 degrees C. for 3 hours. The catalyst was removed from the reaction mixture by filtration and, then, methanol and water were distilled off from the mixture at a reduced pressure to obtain an oily branched organopolysiloxane represented by the following formula. Its Mw was 5729. An amount of the Vi group was 0.038 mol/100 g. The organopolysiloxane was analyzed by $^{29}$Si-NMR to find that n was 37 and m was 1.1, both on average.

Synthesis Example 2

Synthesis of Branched Organopolysiloxane (A-2)

524.1 Grams (1 mol) of 1,1,3,3-tetraphenyl-1,5-dimethyl-5,5-dimethoxytrisiloxane, 1381.2 grams (2.57 mols) of polymethylphenylsiloxane-α,ω-diol, Mw=537.43, and 55.79 grams (0.48 mol) of dimethylvinylmethoxysilane were mixed and heated to 80 degrees C. with stirring. 12 Grams of Sr(OH)$_2$.8H$_2$O were added to the mixture and, then, these compounds were reacted at 80 degrees C. for 12 hours while removing generatedmethanol. The catalyst was removed from the reaction mixture by filtration and, then, methanol and water were distilled off from the mixture at a reduced pressure to obtain an oily branched organopolysiloxane represented by the following formula. Its Mw was 8902. The amount of the Vi group was 0.023 mol/100 g. The organopolysiloxane was analyzed by $^{29}$Si-NMR to find that n was 46 and m was 4.9, both on average.

Synthesis Example 3

Synthesis of Branched Organopolysiloxane (A-3)

142.6 Grams of water was added to a mixture of 955.5 grams (3 mols) of 1,1-diphenyl-1,3-dimethyl-3,3-dimethoxydisiloxane and 69.7 grams (0.6 mol) of dimethylvinylmethoxysilane and, then, 12 grams of Sr(OH)$_2$.8H$_2$O were added thereto with stirring. Then, the mixture was allowed to react at 80 degrees C. for 12 hours, while distilling off generated methanol. The catalyst was removed from the reaction mixture by filtration and, then, methanol and water were distilled off from the mixture at a reduced pressure to obtain an oily branched organopolysiloxane represented by the following formula. Its Mw was 3816. The amount of the Vi group was 0.054 mol/100 g. The organopolysiloxane was analyzed by $^{29}$Si-NMR to find that m was 13, on average.

Synthesis Example 4

Synthesis of Branched Organopolysiloxane (A-4)

127.4 Grams (0.4 mol) of 1,1-diphenyl-1,3-dimethyl-3,3-dimethoxydisiloxane, 749.0 grams (0.5 mol) of polydimethylsiloxane-α,ω-diol, Mw=1498, and 27.90 grams (0.24 mol) of dimethylvinylmethoxysilane were mixed and heated to 80 degrees C. 12 Grams of Sr(OH)$_2$.8H$_2$O were added to the mixture and, then, these compounds were reacted at 80 degrees C. for 12 hours while distilling off generated methanol. The catalyst was removed from the reaction mixture by filtration and, then, methanol and water were distilled off from the mixture at a reduced pressure to obtain an oily branched organopolysiloxane represented by the following formula. Its Mw was 8,634. The amount of the Vi group was 0.024 mol/100 g. The organopolysiloxane was analyzed by $^{29}$Si—NMR to find that n was 98 and m was 4, both on average.

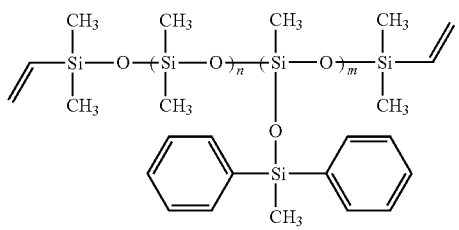

Synthesis Example 5

Synthesis of branched organopolysiloxane (A-5)

194.4 Grams (1 mol) of 1,1,1,3-tetramethyl-3,3-dimethoxydisiloxane, 749.0 grams (0.5 mol) of polydimethylsiloxane-α,ω-diol, Mw-1498, and 13.95 grams (0.12 mol) of dimethylvinylmethoxysilane were mixed and heated to 80 degrees C. with stirring. 12 Grams of Sr(OH)$_2$.8H$_2$O were added to the mixture and, then, these compounds were reacted at 80 degrees C. for 12 hours while distilling off generated methanol. The catalyst was removed from the reaction mixture by filtration and, then, methanol and water were distilled off from the mixture at a reduced pressure to obtain an oily branched organopolysiloxane represented by the following formula. Its Mw was 16,406. The amount of the Vi group was 0.011 mol/100 g. The organopolysiloxane was analyzed by $^{29}$Si-NMR to find that n was 195 and m was 22, both on average.

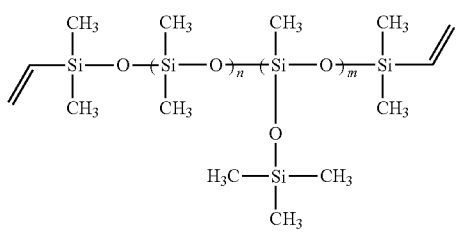

Comparative Synthesis Example

Synthesis of branched organopolysiloxane (A'-6) for Comparative Example

1483 Grams (5 mols) of octamethylcyclotetrasiloxane, 18.6 grams (0.1 mol) of 1,1-divinyltetramethyldisiloxane, 272.5 grams (2 mols) of trimethoxysilane, and 8.1 grams (0.05 mol) of hexamethyldisiloxane, 8.9 grams of potassium hydroxide and 120 g of water were mixed and, then, reacted at 80 degrees C. for 8 hours, while distilling off generated methanol, and further allowed to react at 140 degrees C. for 12 hours while distilling off water. Then, the reaction mixture was cooled to 80 degrees C. and neutralized with 10.1 g of acetic acid. The reaction mixture was washed with water and subjected to distillation at a reduced pressure to obtain an oily branched organopolysiloxane represented by the following formula. Its Mw was 16,701. The amount of the Vi group was 0.011 mol/100 g. The organopolysiloxane was analyzed by $^{29}$Si—NMR to find that n was 100, n' was 100 and m was 20, all on average.

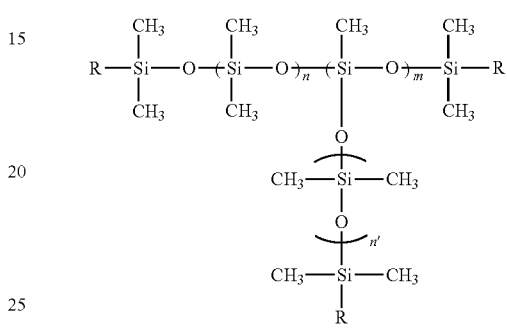

wherein R is —CH$_3$ or —CH═CH$_2$ and at least two, on average, of R is —CH—CH$_2$.

Components (B), (C), (D) and other components used in the following Examples and Comparative Examples are as follows.

(B-1) Silicone oil represented by the following formula, which has 0.60 mol/100 g of an SiH group, ex Shin-Etsu Chemical Co., Ltd.:

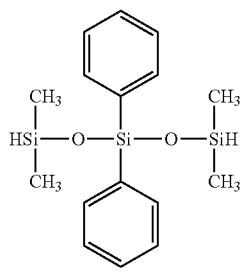

(B-2) Silicone oil represented by the following formula, which has 1.63 mols/100 g of an SiH group, ex Shin-Etsu Chemical Co., Ltd.:

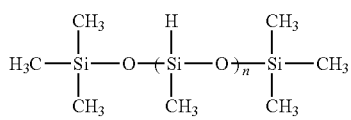

wherein n is 38 on average.

(C) Divinylsiloxane complex of platinum chloride (D-1) Silicone resin represented by the following formula, which has 0.147 mol/100 g of a Vi group and 1,563 of weight-average molecular weight, ex Shin-Etsu Chemical Co., Ltd.:

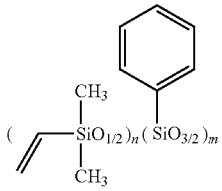

wherein a ratio of the number of n to m is 0.22:0.78 (D-2) Silicone resin represented by the following formula, which has 0.091 mol/100 g of a Vi group and 5,211 of weight-average molecular weight, ex Shin-Etsu Chemical Co., Ltd.:

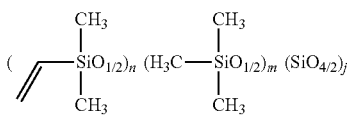

wherein a ratio of the number of n, m and j is 0.06:0.36:0.58.

Other compound (b): Silicone oil represented by the following formula, which has 0.90 mol/100 g of an SiH group, ex Shin-Etsu Chemical Co., Ltd.:

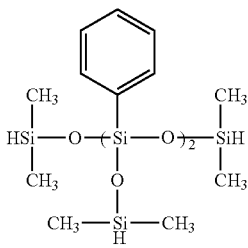

In addition, the following organopolysiloxanes (A'-7), (A'-8) and (A'-9) were used in the Comparative Examples.

(A'-7) Organopolysiloxane represented by the following formula, which has 0.038 mol/100 g of a Vi group, ex Shin-Etsu Chemical Co., Ltd.:

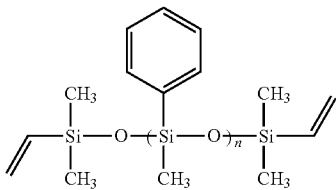

wherein n is 38 on average.

(A'-8) Organopolysiloxane represented by the following formula, which has 0.022 mol/100 g of a Vi group, ex Shin-Etsu Chemical Co., Ltd.:

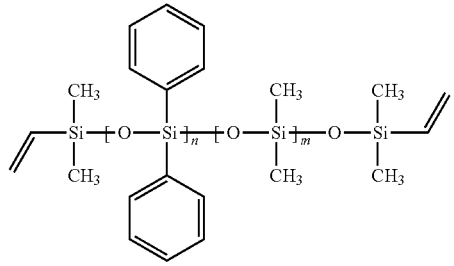

wherein n is 6 and m is 104, on average.

(A'-9) Organopolysiloxane represented by the following formula, which has 0.013 mol/100 g of a Vi group, ex Shin-Etsu Chemical Co., Ltd.:

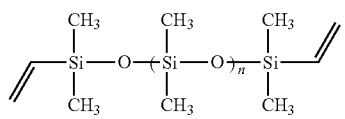

wherein n is 200 on average.

Examples 1 to 7 and Comparative Examples 1 to 4

The aforesaid components except the catalyst were mixed in an amount as described in Tables 1 and, then, the catalyst (C) was added in an amount, reduced as a platinum group metal, of 5 ppm relative to the total mass of the composition, to obtain silicone compositions. The silicone compositions prepared in Examples 1 to 7 and Comparative Examples 1 to 4 were evaluated according to the following manners. In table 1, the value of H/Vi is a ratio of the total number of the hydrosilyl groups to the total number of the vinyl groups.

[1. Viscosity of the Silicone Compositions]

The viscosity of the silicone composition was determined with a B-type viscometer at 23 degrees C. according to the Japanese Industrial Standards (JIS) Z 8803:2011. The results are as shown in Tables 2 and 3.

[2. Hardness of the Cured Products]

The silicone composition was poured into an aluminum petri dish having a diameter of 50 mm and a depth of 10 mm and, then, heated at 60 degrees C. for one hour, 100 degrees C. for one hour and, subsequently 150 degrees C. for 4 hours to obtain a cured product. A hardness of the cured product was determined with durometer type A or D according to the Japanese Industrial Standards (JIS) K 6253-3:2012. The results are as shown in Tables 2 and 3.

[3. Light Transmittance of the Cured Products]

A concave Teflon (Trademark) spacer having a depth of 1 mm was sandwiched by two glass slides having dimensions of 50 mm×20 mm×1 mm and tightly held. The silicone composition was poured into the dent of the concave Teflon spacer and heated at 60 degrees C. for one hour, 100 degrees C. for one hour and, subsequently 150 degrees C. for 4 hours to cure, to obtain a sample. A transmittance at 450 nm of the sample was determined with a spectrophotometer, U-4100, ex Hitachi High-Technologies Corporation. The results are as shown in Tables 2 and 3.

[4. Tensile Strength and Elongation at Break of the Cured Products]

The silicone composition was poured into a Teflon-coated mold having a cavity of 150 mm×200 mm×2 am, and cured stepwise at 60 degrees C. for one hour, 100 degrees C. for one hour and, subsequently 150 degrees C. for 4 hours to obtain a sample. A tensile strength and elongation at break of the cured product were determined according to JIS K 6251:2010 with EZ TEST, EZ-L, ex Shimadzu Corporation, in the following conditions: a tensile speed was 500 mm/min, a distance between clamps was 80 mm, and a distance of gauge points was 40 mm. The results are as shown in Tables 2 and 3.

[5. Glass-Transition Temperature of the Cured Products]

The storage elastic modulus, MPa, of the cured product prepared as in 4. above procedures was determined at a temperature between −140 degrees C. and 150 degrees C. with DMA 0800, ex TA Instruments. A temperature at a peak in a curved of tangent δ, calculated from obtained storage elastic modulus vs temperature is a glass transition temperature (Tg). The storage elastic modulus was determined in the following conditions: the sample had a length of 20 mm, a width of 5 mm and a thickness of 1 mm, a rate of temperature rise was 5° C./minute; and a multi-frequency mode, a tension mode, and an amplitude of 15 μm. The results are as shown in Tables 2 and 3. In FIG. 1, the storage elastic modulus (dotted line) and the Tangent δ (solid line) are shown for Example 1 and Comparative Example 1.

[6. Thermal Cycle Test]

The silicone composition was dispensed on a Tiger352B package, ex Shin-Etsu Chemical Co., Ltd., and heated at 60 degrees C. for one hour, 100 degrees C. for one hour and, subsequently 150 degrees C. for 4 hours to cure, to obtain 20 sample packages encapsulated with the cured product. The 20 samples were subjected to a thermal cycle test (TCT) with 1000 thermal cycles of −50 to 140 degrees C. and vice-versa. The number of the test samples which had cracks was counted. The results are as shown in Tables 2 and 3.

TABLE 1

(Part by mass)

| | | Ex. 1 | Ex. 2 | Ex. 3 | Ex. 4 | Ex. 5 | Ex. 6 | Ex. 7 | Com. Ex. 1 | Com. Ex. 2 | Com. Ex. 3 | Com. Ex. 4 |
|---|---|---|---|---|---|---|---|---|---|---|---|---|
| (A) | (A-1) | 100 | 100 | 100 | — | — | — | — | — | — | — | — |
| | (A-2) | — | — | — | 100 | — | — | — | — | — | — | — |
| | (A-3) | — | — | — | — | 100 | — | — | — | — | — | — |
| | (A-4) | — | — | — | — | — | 100 | — | — | — | — | — |
| | (A-5) | — | — | — | — | — | — | 100 | — | — | — | — |
| | (A'-6) | — | — | — | — | — | — | — | — | — | — | 100 |
| | (A'-7) | — | — | — | — | — | — | — | 100 | — | — | — |
| | (A'-8) | — | — | — | — | — | — | — | — | 100 | — | — |
| | (A'-9) | — | — | — | — | — | — | — | — | — | 100 | — |
| (B) | (B-1) | 73.7 | 8.8 | 242 | 19.4 | 60 | — | — | 73.7 | — | — | — |
| | (B-2) | — | — | — | — | — | 8.5 | 10.9 | — | 8.5 | 10.9 | 10.9 |
| | (b) | 3.9 | 8.8 | — | 2.2 | 6.7 | — | 3.9 | — | — | — | — |
| (D) | (D-1) | 300 | 10 | 800 | 100 | 250 | — | — | 300 | — | — | — |
| | (D-2) | — | — | — | — | — | 100 | 150 | — | 100 | 150 | 150 |
| (C) | | 5 ppm as platinum, relative to a total amount of the composition | | | | | | | | | | |
| | H/Vi | 1 | 2.5 | 1.2 | 0.8 | 1 | 1.2 | 1.8 | 1 | 1.2 | 1.8 | 1.8 |

TABLE 2

| | | | | Ex. 1 | Ex. 2 | Ex. 3 | Ex. 4 | Ex. 5 | Ex. 6 | Ex. 7 |
|---|---|---|---|---|---|---|---|---|---|---|
| Evaluation | Viscosity | 23 degrees C. | Pa · s | 3.4 | 2.1 | 16.8 | 8.6 | 2.4 | 3.6 | 5.4 |
| | Hardness | Type A | — | — | — | 38 | — | 62 | 45 | 71 | 76 |
| | | Shore D | — | — | 30 | — | 56 | — | — | — | — |
| | Transmittance | Thickness of 1 mm, 450 nm | % T | 99.4 | 99.3 | 99.3 | 99.4 | 99.2 | 99.4 | 99.4 |
| | Tensile strength | 25 degrees C. | MPa | 4.2 | 0.8 | 8.6 | 1.8 | 1.2 | 6.3 | 7.9 |
| | Elongation at break | 25 degrees C. | % | 70 | 150 | 50 | 90 | 100 | 80 | 90 |
| | Tg | By DMA | degrees C. | 18 | 12 | 23 | 5 | −4 | −103 | −122 |
| | Thermal cycle test | 1000 thermal cycles of −50 to/from 140 degrees C. | Number of the cracked samples | 0/20 | 0/20 | 0/20 | 0/20 | 0/20 | 0/20 | 0/20 |

TABLE 3

| | | | | Com. Ex. 1 | Com. Ex. 2 | Com. Ex. 3 | Com. Ex. 4 |
|---|---|---|---|---|---|---|---|
| Evaluation | Viscosity | 23 degrees C. | Pa · s | 4.8 | 4.6 | 6.2 | 5.9 |
| | Hardness | Type A | — | — | — | 75 | 81 | 79 |
| | | Shore D | — | 45 | — | — | — |
| | Tranamittance | Thickness of 1 mm, 450 nm | % T | 99.4 | 99.4 | 99.4 | 99.4 |
| | Tensile strength | 25 degrees C. | MPa | 4.8 | 6.8 | 8.8 | 8.5 |
| | Elongation at break | 25 degrees C. | % | 60 | 70 | 70 | 70 |
| | Tg | By DMA | degrees C. | 28 | −98 | −113 | −116 |

TABLE 3-continued

|  |  |  | Com. Ex. 1 | Com. Ex. 2 | Com. Ex. 3 | Com. Ex. 4 |
|---|---|---|---|---|---|---|
| Thermal cycle test | 1000 thermal cycles of −50 to/from 140 degrees C. | Number of the cracked samples | 20/20 | 12/20 | 14/20 | 14/20 |

As seen in Table 3, the cured products obtained from the silicone compositions comprising the organopolysiloxane having a long branched chain or obtained from the silicone compositions comprising the organopolysiloxane having no branched chain had poor resistance at a low and high temperature and caused cracks in the TCT test. In contrast, as seen in Table 2, the present silicone compositions provided a cured product showing the excellent resistance at a low and high temperature and did not cause cracks in the TCT test. Additionally, in a comparison between the compositions comprising the organopolysiloxane having the similar length of the molecular chain, such as a comparison between Example 1 and Comparative Example 1, a comparison between Example 6 and Comparative Example 2, and a comparison between Example 7 and Comparative Examples 3 and 4, the glass-transition temperature of the cured product obtained from the composition comprising the branched organopolysiloxane is lower, compared to that of the cured product obtained from the composition comprising the linear organopolysiloxane or the organopolysiloxane having a long branched chain. The glass-transition temperatures of the cured products obtained in Examples 6 and 7 and Comparative Examples 2 to 4 are lower than those of the cured products obtained in Examples 1 to 5 and Comparative Example 1. This is because one or all of components (A), (B) and (D) does not have an aromatic group in Examples 6 and 7 and Comparative Examples 2 to 4.

[Water Vapor Permeability of the Cured Products]

Each of the silicone compositions prepared in Examples 1 and 7 and Comparative Example 1 was poured into a Teflon-coated mold having a cavity of 150 mm×200 mm×2 mm and cured stepwise at 60 degrees C. for one hour, 100 degrees C. for one hour and, subsequently 150 degrees C. for 4 hours to obtain a test sample. A water vapor permeability of the test sample was determined in a Lyssy method with L80-5000, ex Systech Instruments Ltd. according to JIS K 7129. The results are as follows.

Example 1: 14 g·m²/day
Example 7: 52 g·m²/day
Comparative Example 1: 13 g·m²/day Each of components (A) and (B) comprised in the compositions of Example 1 and Comparative Example 1 has the aromatic group. None of components (A) and (B) in the composition of Example 7 has an aromatic group. As seen in the aforesaid results, it is preferable that both of components (A) and (B) have an aromatic group in order to obtain a cured product having a lower gas permeability.

INDUSTRIAL APPLICABILITY

A cured product obtained from the present addition-curable silicone composition has good properties at low temperatures, an excellent resistance in temperature change and an excellent crack resistance. Accordingly, the present addition-curable silicone composition may be used to encapsulate a semiconductor element to provide a semiconductor device having an excellent reliability. Further, the present addition-curable silicone composition provides a cured product having a high light transmittance, so that the present addition-curable silicone composition is usable as an encapsulating material for LEDs, in particular, blue LEDs and ultraviolet LEDs.

The invention claimed is:

1. An addition-curable silicone composition comprising the following components (A) to (C):
   (A) a branched organopolysiloxane having at least two alkenyl groups and represented by the following formula (1):

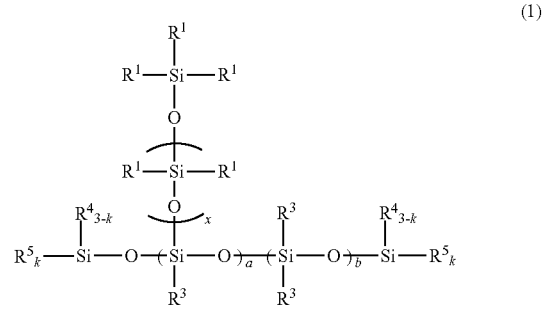

(1)

wherein $R^1$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^3$ is, independently of each other, a substituted or unsubstituted, saturated hydrocarbon group having 1 to 12 carbon atoms, a substituted or unsubstituted, aromatic hydrocarbon group having 6 to 12 carbon atoms, or an alkenyl group having 2 to 10 carbon atoms, $R^4$ is, independently of each other, a substituted or unsubstituted, saturated hydrocarbon group having 1 to 6 carbon atoms or a substituted or unsubstituted, aromatic hydrocarbon group having 6 to 12 carbon atoms, $R^5$ is, independently of each other, an alkenyl group having 2 to 10 carbon atoms, k is an integer of from 0 to 3, provided that this organopolysiloxane has at least two alkenyl groups, x is an integer of from 0 to 3, a is an integer of from 1 to 100, and b is an integer of from 0 to 300, provided that a total of a and b is 1 to 400, wherein the parenthesized siloxane units may bond randomly or form a block unit;
   (B) an organohydrogenpolysiloxane having at least two hydrosilyl groups, in an amount such that a ratio of the number of the hydrosilyl groups in component (B) to the number of the alkenyl groups in component (A) is 0.4 to 4, and
   (C) a hydrosilylation catalyst in a catalytic amount.

2. The addition-curable silicone composition according to claim 1, further comprising (D) an organopolysiloxane having a network structure and represented by the following formula (2):

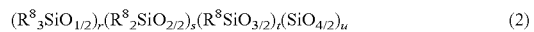

(2)

wherein R⁸ is, independently of each other, selected from the group consisting of a substituted or unsubstituted, saturated hydrocarbon group having 1 to 12 carbon atoms, a substituted or unsubstituted, aromatic hydrocarbon group having 6 to 12 carbon atoms, and an alkenyl group having 2 to 10 carbon atoms, provided that at least two of R⁸ are an alkenyl group, r is an integer of from 0 to 100, s is an integer of from 0 to 300, t is an integer of from 0 to 200, and u is an integer of from 0 to 200, provided that a total of t and u is 1 to 400 and a total of r, s, t and u is 2 to 800, r, s, t, and u are such that this organopolysiloxane has at least two alkenyl groups, in an amount of 5 to 900 parts by mass, relative to 100 parts by mass of component (A) and a ratio of the number of the hydrosilyl groups in component (B) to a total number of the alkenyl groups in components (A) and (D) is 0.4 to 4.

3. The addition-curable silicone composition according to claim 1, wherein x is zero.

4. The addition-curable silicone composition according to claim 1, wherein at least one of R¹ is an aromatic hydrocarbon group having 6 to 12 carbon atoms.

5. The addition-curable silicone composition according to claim 1, wherein (A) the branched organopolysiloxane has a monovalent aromatic hydrocarbon group bonded to a silicon atom, in an amount of from 3% or more to 90% or less in number, based on a total number of the groups each bonded to a silicon atom.

6. The addition-curable silicone composition according to claim 1, wherein component (B) is represented by the following formula (4):

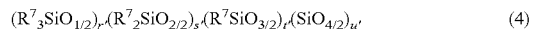  (4)

wherein R⁷ is, independently of each other, a hydrogen atom, a substituted or unsubstituted, saturated hydrocarbon group having 1 to 12 carbon atoms, or a substituted or unsubstituted, aromatic hydrocarbon group having 6 to 12 carbon atoms, at least two of R⁷ are hydrogen atoms, r' is an integer of from 0 to 100, s' is an integer of from 0 to 300, t' is an integer of from 0 to 200, and u' is an integer of from 0 to 200, a total of r', s', t' and u' is 2 to 800, provided that r', s', t', and u' are such that this organohydrogenpolysiloxane has at least two hydrogen atoms.

7. A semiconductor device provided with a cured product obtained by curing the addition-curable silicone composition according to claim 1.

8. The semiconductor device according to claim 7, wherein the semiconductor device has a semiconductor element which is encapsulated with said cured product.

9. The semiconductor device according to claim 8, wherein the semiconductor element is a light emitter.

* * * * *